US006922713B2

(12) United States Patent
Walster et al.

(10) Patent No.: US 6,922,713 B2
(45) Date of Patent: Jul. 26, 2005

(54) METHOD AND APPARATUS FOR SOLVING AN UNCONSTRAINED GLOBAL OPTIMIZATION PROBLEM

(75) Inventors: G. William Walster, Cupertino, CA (US); Eldon R. Hansen, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 610 days.

(21) Appl. No.: 10/042,909

(22) Filed: Jan. 8, 2002

(65) Prior Publication Data

US 2003/0130971 A1 Jul. 10, 2003

(51) Int. Cl.[7] .................................................. G06F 7/38
(52) U.S. Cl. ........................................ 708/446; 700/33
(58) Field of Search ................................ 708/270, 440, 708/446; 700/28, 33; 706/19

(56) References Cited

U.S. PATENT DOCUMENTS

| 5,008,672 | A  | * | 4/1991  | Leedy            |        |
|-----------|----|---|---------|------------------|--------|
| 5,014,230 | A  | * | 5/1991  | Sinha et al.     |        |
| 6,327,581 | B1 | * | 12/2001 | Platt            | 706/12 |
| 6,560,623 | B1 | * | 5/2003  | Smith            |        |
| 6,563,566 | B2 | * | 5/2003  | Rosenbluth et al.| 355/67 |

OTHER PUBLICATIONS

E.R. Hansen, "Global Optimization Using Interval Analysis," Marcel Dekker, Inc., New York, NY, 1992.
R.B. Kearfott, "A Fortran 90 Environment for Research and Prototyping of Enclosure Algorithms for Nonlinear Equations and Global Optimization," ACM Transactions on Mathematical Software, vol. 21, No. 1, Mar. 1995, pp. 63–78 http://interval.louisiana.edu/preprints.html.
R. B. Kearfott, Algorithm 763: Interval Arithmetic: A Fortran 90 Module for an Interval Data Type, ACM Trans. Math. Software, 22, vol. 4, 1996, pp. 385–392. http://interval.louisiana.edu/preprints.html.
R. B. Kearfott, M. Dawande, K.S. Du, and C. Hu, "Algorithm 737: INTLIB: A Portable Fortran 737 Interval Standard Function Library," ACM Trans. Math. Software, 20, vol. 4, Dec. 1994, pp. 447–458.
R. B. Kearfott and G.W. Walster, "On Stopping Criteria in Verified Nonlinear Systems or Optimization Algorithms," ACM Trans. Math. Software, 26, vol. 3, Sep. 2000, pp. 323–351. The publication itself says Received: Jul. 1999; revised: Mar. 2000; accepted: Mar. 2000. http://interval.louisiana.edu/preprints.html.

(Continued)

*Primary Examiner*—Chuong Dinh Ngo
(74) *Attorney, Agent, or Firm*—Park, Vaughan & Fleming, LLP

(57) ABSTRACT

One embodiment of the present invention provides a system that receives a representation of the function $f$ and stores the representation in a memory. Next, the system performs an interval global optimization process to compute guaranteed bounds on a globally minimum value of the function $f(x)$ over a subbox X. This interval global optimization process applies term consistency to a set of relations associated with the function $f$ over the subbox X, and excludes any portion of the subbox X that violates any member of the set of relations. It also applies box consistency to the set of relations associated with the function $f$ over the subbox X, and excludes any portion of the subbox X that violates the set of relations. The interval global optimization process also performs an interval Newton step on the subbox X to produce a resulting subbox Y, wherein the point of expansion of the interval Newton step is a point x within the subbox X, and wherein performing the interval Newton step involves evaluating the gradient $g(x)$ of the function $f(x)$ using interval arithmetic. The system integrates the subparts of the process with branch tests designed to increase the overall speed of the process.

36 Claims, 8 Drawing Sheets

OTHER PUBLICATIONS

R.E. Moore and S.T. Jones "Safe Starting Regions for Iterative Methods", SIAM Journal on Numerical Analysis, vol. 14, No. 6 (Dec. 1977), pp. 1051–1065.

A. Neumaier, "The Enclosure of Solutions of Parameter-Dependent Systems of Euqations," Cambridge University Press, Cambridge, 1990, ISBN: 0–12–505630–3, Reliability in Computing pp. 269–286.

S.M. Rump, "Verification Methods for Dense and Sparse Systems of Equations," in Topics in Validated Computations: Proceedings of the IMACS–GAMM International Workshop on Validated Computations, University of Oldenburg, J. Herzberger, ed., Elsevier Studies in Computational Mathematics, Elsevier, 1994, pp. 63–136.

Pascal Van Hentenryck, Vijay Saraswat and Yves Deville, "Design, Implementation, and Evaluation of the Constraint Language cc (FD)," Elsevier Science, Inc., 1998.

* cited by examiner $$X \equiv [\underline{x}, \overline{x}] \equiv \{x \in \Re^* | \underline{x} \leq x \leq \overline{x}\}$$

$$Y \equiv [\underline{y}, \overline{y}] \equiv \{y \in \Re^* | \underline{y} \leq y \leq \overline{y}\}$$

(1) $X + Y = [\downarrow \underline{x} + \underline{y}, \uparrow \overline{x} + \overline{y}]$ (2) $X - Y = [\downarrow \underline{x} - \overline{y}, \uparrow \overline{x} - \underline{y}]$ (3) $X \times Y = [\min(\downarrow \underline{x} \times \underline{y}, \underline{x} \times \overline{y}, \overline{x} \times \underline{y}, \overline{x} \times \overline{y}), \max(\uparrow \underline{x} \times \underline{y}, \underline{x} \times \overline{y}, \overline{x} \times \underline{y}, \overline{x} \times \overline{y})]$ (4) $X / Y = [\min(\downarrow \underline{x}/\underline{y}, \underline{x}/\overline{y}, \overline{x}/\underline{y}, \overline{x}/\overline{y}), \max(\uparrow \underline{x}/\underline{y}, \underline{x}/\overline{y}, \overline{x}/\underline{y}, \overline{x}/\overline{y})]$, if $0 \notin Y$ $X/Y \subseteq \Re^*$, if $0 \in Y$

FIG. 5

METHOD AND APPARATUS FOR SOLVING AN UNCONSTRAINED GLOBAL OPTIMIZATION PROBLEM

RELATED APPLICATION

The subject matter of this application is related to the subject matter in a co-pending non-provisional application by the same inventors as the instant application entitled, "Applying Term Consistency to the Solution of Unconstrained Interval Global Optimization Problems," having Ser. No. 09/991,476, and filing date 16 Nov. 2001.

BACKGROUND

1. Field of the Invention

The present invention relates to performing arithmetic operations on interval operands within a computer system. More specifically, the present invention relates to a method and an apparatus for using a computer system to solve an unconstrained global optimization problem with interval arithmetic.

2. Related Art

Rapid advances in computing technology make it possible to perform trillions of computational operations each second. This tremendous computational speed makes it practical to perform computationally intensive tasks as diverse as predicting the weather and optimizing the design of an aircraft engine. Such computational tasks are typically performed using machine-representable floating-point numbers to approximate values of real numbers. (For example, see the Institute of Electrical and Electronics Engineers (IEEE) standard 754 for binary floating-point numbers.)

In spite of their limitations, floating-point numbers are generally used to perform most computational tasks.

One limitation is that machine-representable floating-point numbers have a fixed-size word length, which limits their accuracy. Note that a floating-point number is typically encoded using a 32, 64 or 128-bit binary number, which means that there are only $2^{32}$, $2^{64}$ or $2^{128}$ possible symbols that can be used to specify a floating-point number. Hence, most real number values can only be approximated with a corresponding floating-point number. This creates estimation errors that can be magnified through even a few computations, thereby adversely affecting the accuracy of a computation.

A related limitation is that floating-point numbers contain no information about their accuracy. Most measured data values include some amount of error that arises from the measurement process itself. This error can often be quantified as an accuracy parameter, which can subsequently be used to determine the accuracy of a computation. However, floating-point numbers are not designed to keep track of accuracy information, whether from input data measurement errors or machine rounding errors. Hence, it is not possible to determine the accuracy of a computation by merely examining the floating-point number that results from the computation.

Interval arithmetic has been developed to solve the above-described problems. Interval arithmetic represents numbers as intervals specified by a first (left) endpoint and a second (right) endpoint. For example, the interval [a, b], where a<b, is a closed, bounded subset of the real numbers, R, which includes a and b as well as all real numbers between a and b. Arithmetic operations on interval operands (interval arithmetic) are defined so that interval results always contain the entire set of possible values. The result is a mathematical system for rigorously bounding numerical errors from all sources, including measurement data errors, machine rounding errors and their interactions. (Note that the first endpoint normally contains the "infimum", which is the largest number that is less than or equal to each of a given set of real numbers. Similarly, the second endpoint normally contains the "supremum", which is the smallest number that is greater than or equal to each of the given set of real numbers.)

One commonly performed computational operation is to perform global optimization to find a global minimum of an objective function. This can be accomplished using any members of a set of criteria to delete boxes, or parts of boxes that cannot contain the global minimum $f^*$. The set of criteria includes:

(1) the $f\_bar$-criterion, wherein if $f\_bar$ is the smallest upper bound so far computed on $f^*$, then any point x for which $f(x)>f\_bar$ can be deleted. Similarly, any box X can be deleted if $inf(f(X))>f\_bar$;

(2) the monotonicity criterion, wherein if g(x) is the gradient of $f$ evaluated at x, then any point x for which $g(x)\neq 0$ can be deleted. Similarly, any box X can be deleted if $0 \notin g(X)$;

(3) the convexity criterion, wherein if $H_{ii}(x)$ is the i-th diagonal element of the Hessian of $f$, then any point x for which $H_{ii}(x)<0$ (for i=1, . . . , n) can be deleted. Similarly, any box X can be deleted if $H_{ii}(X)<0$ (for i=1, . . . , n); and (4) the stationary point criterion, wherein points x are deleted using the interval Newton technique to solve the equation g(x)=0.

These criteria work best "in the small" when the objective function $f$ is approximately quadratic. For large intervals containing multiple stationary points the above criteria might not succeed in deleting much of a given box. In this case the box is split into two or more sub-boxes that are processed independently. By this mechanism all the global minima of a nonlinear objective function can be found.

One problem is applying this procedure to large n-dimensional interval vectors (or boxes) that contain multiple local minima. In this case, the process of splitting in n-dimensions can lead to exponential growth in the number of boxes to process.

It is well known that this problem (and even the problem of computing "sharp" bounds on the range of a function of n-variables over an n-dimensional box) is an "NP-hard" problem. In general, NP-hard problems require an exponentially increasing amount of work to solve as n, the number of independent variables, increases.

Because NP-hardness is a worst-case property and because many practical engineering and scientific problems have relatively simple structure, one problem is to use this simple structure of real problems to improve the efficiency of interval global optimization algorithms.

Hence, what is needed is a method and an apparatus for using the structure of a nonlinear objective function to improve the efficiency of interval global optimization software. To this end, what is needed is a method and apparatus that efficiently deletes "large" boxes or parts of large boxes that the above criteria can only split.

SUMMARY

The present invention combines various methods to speed up the solution of systems of nonlinear equations. The combined methods use the structure of the objective function to efficiently delete parts of all of large sub-boxes that would otherwise have to be split. One embodiment of the present invention provides a system that solves an unconstrained interval global optimization problem specified by a function $f$, wherein $f$ is a scalar function of a vector $x=(x_1, x_2, x_3, \ldots x_n)$. The system operates by receiving a representation of the function $f$, and then performing an interval global optimization process to compute guaranteed bounds on a globally minimum value $f^*$ the function $f(x)$ and the location or locations $x^*$ of the global minimum. While performing the interval global optimization process, the system deletes all of part of a subbox X for which $f(x) > f\_bar$, wherein $f\_bar$ is the smallest upper bound on $f^*$ that has been so far computed. This is called the "$f\_bar$ test". The system applies term consistency to the $f\_bar$ test over the subbox X to increase that portion of the subbox X that can be proved to violate the $f\_bar$ test.

For any function of n-variables $f(x)$ there are different ways to analytically solve for a component $x_j$ of the vector x. For example, one can write $f(x)=0$ in an equivalent form $f(x)=g(x_j)-h(x)=0$, where $g(x_j)$ is a term in $f$ for which it is possible to solve $g(x_j)=y$ for any $x_j$ using $g^{-1}(y)$. For each of these rearrangements, if a given interval box X is used as an argument of h, and if $X_j^+ = X_j \cap X'_j$ where $X'_j = g^{-1}(h(X))$, then the new interval $X_j^+$ for the j-th component of X, is guaranteed to be at least as narrow as the original $X_j$.

This process is then iterated using different terms g of the function $f$. After reducing any element $X_j$ of the box X to $X_j^+$, the reduced value can be used in X thereafter to speed up the reduction process using other component functions and terms thereof.

Hereafter, the notation $g(x_j)$ for a term of the function $f(x)$ implicitly represents any term of any component function. This eliminates the need for additional subscripts that do not add clarity to the exposition.

One embodiment of the present invention provides a system that receives a representation of the function $f$ and stores the representation in a memory. Next, the system performs an interval global optimization process to compute guaranteed bounds on a globally minimum value of the function $f(x)$ over a subbox X. This interval global optimization process applies term consistency to a set of relations associated with the function $f$ over the subbox X, and excludes any portion of the subbox X that violates any of the relations. It also applies box consistency to the set of relations associated with the function $f$ over the subbox X, and excludes any portion of the subbox X that violates any of the relations. The interval global optimization process also performs an interval Newton step on the subbox X to produce a resulting subbox Y, wherein the point of expansion of the interval Newton step is a point x within the subbox X, and wherein performing the interval Newton step involves evaluating the gradient $g(x)$ of the function $f(x)$ using interval arithmetic.

In a variation on this embodiment, while applying term consistency, the system symbolically manipulates an equation within the computer system to solve for a term $g(x_j)$, thereby producing a modified equation $g(x_j)=h(x)$, wherein the term $g(x_j)$ can be analytically inverted to produce an inverse function $g^{-1}(y)$. Next, the system substitutes the subbox X into the modified equation to produce the equation $g(X'_j)=h(X)$, and solves for $X'_j=g^{-1}(h(X))$. The system then intersects $X'_j$ with the interval $X_j$ to produce a new interval $X_j^+$. The resulting subbox $X^+$ contains all solutions of the equation within the subbox X, and the size of the new subbox $X^+$ is less than or equal to the size of the subbox X.

In a variation on this embodiment, while performing the interval global optimization process, the system keeps track of a smallest upper bound $f\_bar$ of the function $f(x)$ and removes from consideration any subbox X for which $f(X) > f\_bar$. In this variation, applying term consistency to the $f\_bar$ relation involves applying term consistency to the inequality $f(x) \leq f\_bar$ over the subbox X. In a further variation, applying box consistency to the $f\_bar$ relation involves applying box consistency to the inequality $f(x) \leq f\_bar$ over the subbox X.

In a variation on this embodiment, while performing the interval global optimization process, the system determines the gradient $g(x)$ of the function $f(x)$ and removes from consideration any subbox for which any element of $g(x)$ is bounded away from zero, thereby indicating that the subbox does not include a stationary point of $f(x)$. In this variation, applying term consistency to the set of relations involves applying term consistency to each component $g_i(x)=0$ ($i=1, \ldots, n$) of $g(x)=0$ over the subbox X. In a further variation, applying box consistency to the set of relations involves applying box consistency to each component $g_i(x)=0$ ($i=1, \ldots, n$) of $g(x)=0$ over the subbox X.

In a variation on this embodiment, while performing the interval global optimization process, the system determines diagonal elements $H_{ii}(x)$ ($i=1, \ldots, n$) of the Hessian of the function $f(x)$, and removes from consideration any subbox for which a diagonal element of the Hessian is always negative, which indicates that the function $f$ is not convex and consequently does not contain a global minimum within the subbox. In this variation, applying term consistency to the set of relations involves applying term consistency to each inequality $H_{ii}(x) \geq 0$ ($i=1, \ldots, n$) over the subbox X. In a further variation, applying box consistency to the set of relations involves applying box consistency to each inequality $H_{ii}(x) \geq 0$ ($i=1, \ldots, n$) over the subbox X.

In a variation on this embodiment, performing the interval Newton step involves: computing the Jacobian $J(x,X)$ of the gradient g evaluated as a function of a point x over the subbox X; computing an approximate inverse B of the center of $J(x,X)$; and using the approximate inverse B to analytically determine the system $Bg(x)$, wherein $g(x)$ is the gradient of the function $f(x)$, and wherein $g(x)$ includes components $g_i(x)(i=1, \ldots, n)$. In this variation, applying term consistency to the set of relations involves applying term consistency to each component $(Bg(x))_i=0$ ($i=1, \ldots, n$) for each variable $x_i$ ($i=1, \ldots, n$) over the subbox X. In a further variation, applying box consistency to the set of relations involves applying box consistency to each component $(Bg(x))_i=0$ ($i=1, \ldots, n$) for each variable $x_i$ ($i=1, \ldots, n$) over the subbox X.

In a variation on this embodiment, the system terminates attempts to further reduce the subbox X when the width of X is less than a first threshold value, and the magnitude of $f(X)$ is less than a second threshold value.

BRIEF DESCRIPTION OF THE FIGURES

FIG. 5 illustrates four different interval operations in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Computer System

Figure 1:
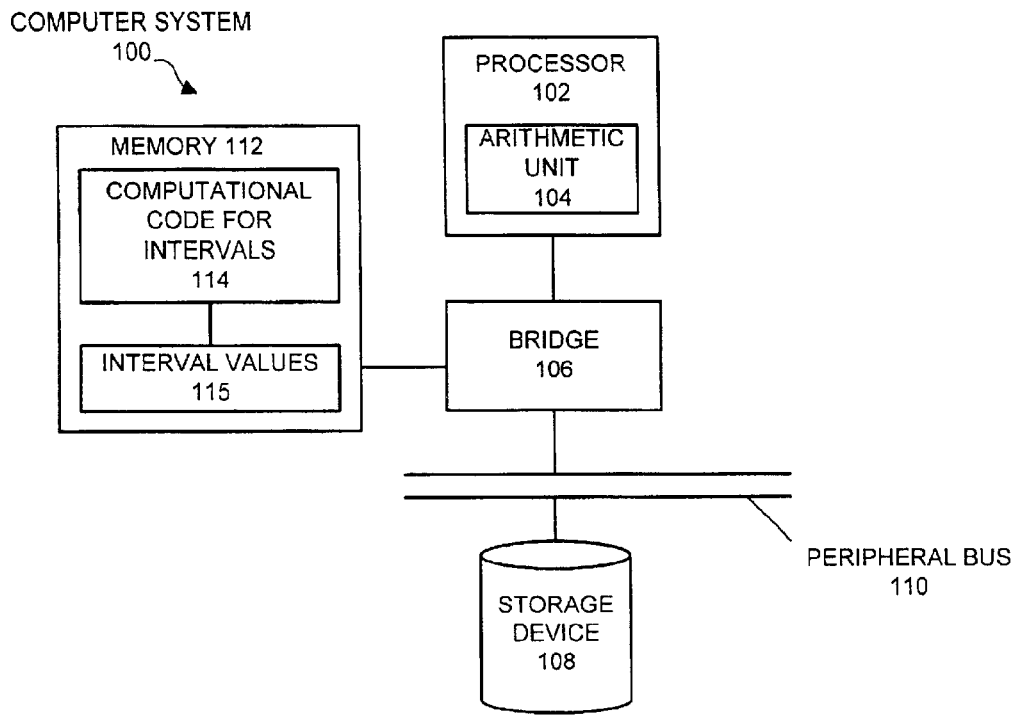
FIG. 1 illustrates a computer system in accordance with an embodiment of the present invention.

FIG. 1 illustrates a computer system 100 in accordance with an embodiment of the present invention. As illustrated in FIG. 1, computer system 100 includes processor 102, which is coupled to a memory 112 and a to peripheral bus 110 through bridge 106. Bridge 106 can generally include any type of circuitry for coupling components of computer system 100 together.

Processor 102 can include any type of processor, including, but not limited to, a microprocessor, a mainframe computer, a digital signal processor, a personal organizer, a device controller and a computational engine within an appliance. Processor 102 includes an arithmetic unit 104, which is capable of performing computational operations using floating-point numbers.

Processor 102 communicates with storage device 108 through bridge 106 and peripheral bus 110. Storage device 108 can include any type of non-volatile storage device that can be coupled to a computer system. This includes, but is not limited to, magnetic, optical, and magneto-optical storage devices, as well as storage devices based on flash memory and/or battery-backed up memory.

Processor 102 communicates with memory 112 through bridge 106. Memory 112 can include any type of memory that can store code and data for execution by processor 102. As illustrated in FIG. 1, memory 112 contains computational code for intervals 114. Computational code 114 contains instructions for the interval operations to be performed on individual operands, or interval values 115, which are also stored within memory 112. This computational code 114 and these interval values 115 are described in more detail below with reference to FIGS. 2–5.

Note that although the present invention is described in the context of computer system 100 illustrated in FIG. 1, the present invention can generally operate on any type of computing device that can perform computations involving floating-point numbers. Hence, the present invention is not limited to the computer system 100 illustrated in FIG. 1.

Compiling and Using Interval Code

Figure 2:
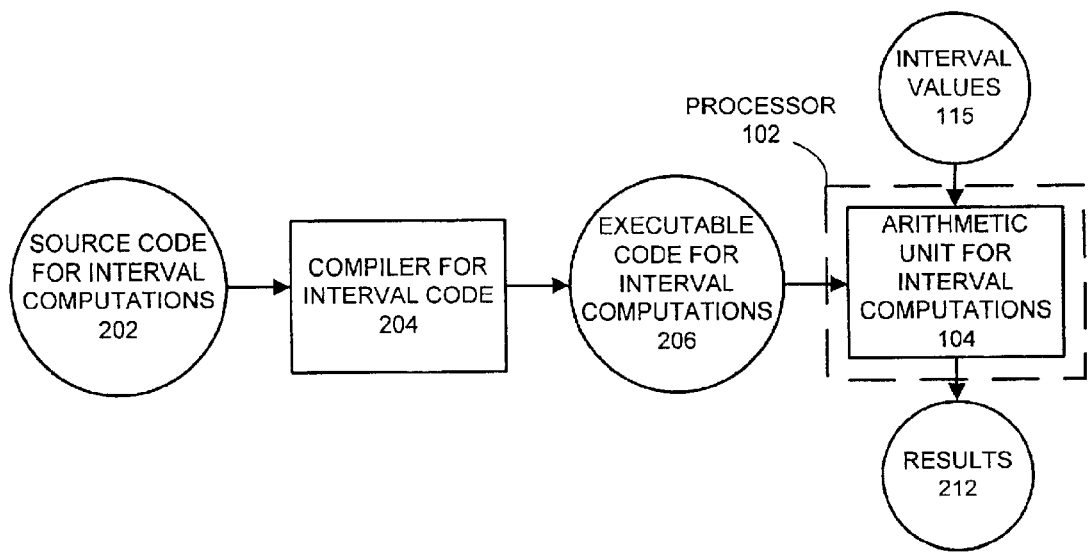
FIG. 2 illustrates the process of compiling and using code for interval computations in accordance with an embodiment of the present invention.

FIG. 2 illustrates the process of compiling and using code for interval computations in accordance with an embodiment of the present invention. The system starts with source code 202, which specifies a number of computational operations involving intervals. Source code 202 passes through compiler 204, which converts source code 202 into executable code form 206 for interval computations. Processor 102 retrieves executable code 206 and uses it to control the operation of arithmetic unit 104.

Processor 102 also retrieves interval values 115 from memory 112 and passes these interval values 115 through arithmetic unit 104 to produce results 212. Results 212 can also include interval values.

Note that the term "compilation" as used in this specification is to be construed broadly to include pre-compilation and just-in-time compilation, as well as use of an interpreter that interprets instructions at run-time. Hence, the term "compiler" as used in the specification and the claims refers to pre-compilers, just-in-time compilers and interpreters.

Arithmetic Unit for Intervals

Figure 3:
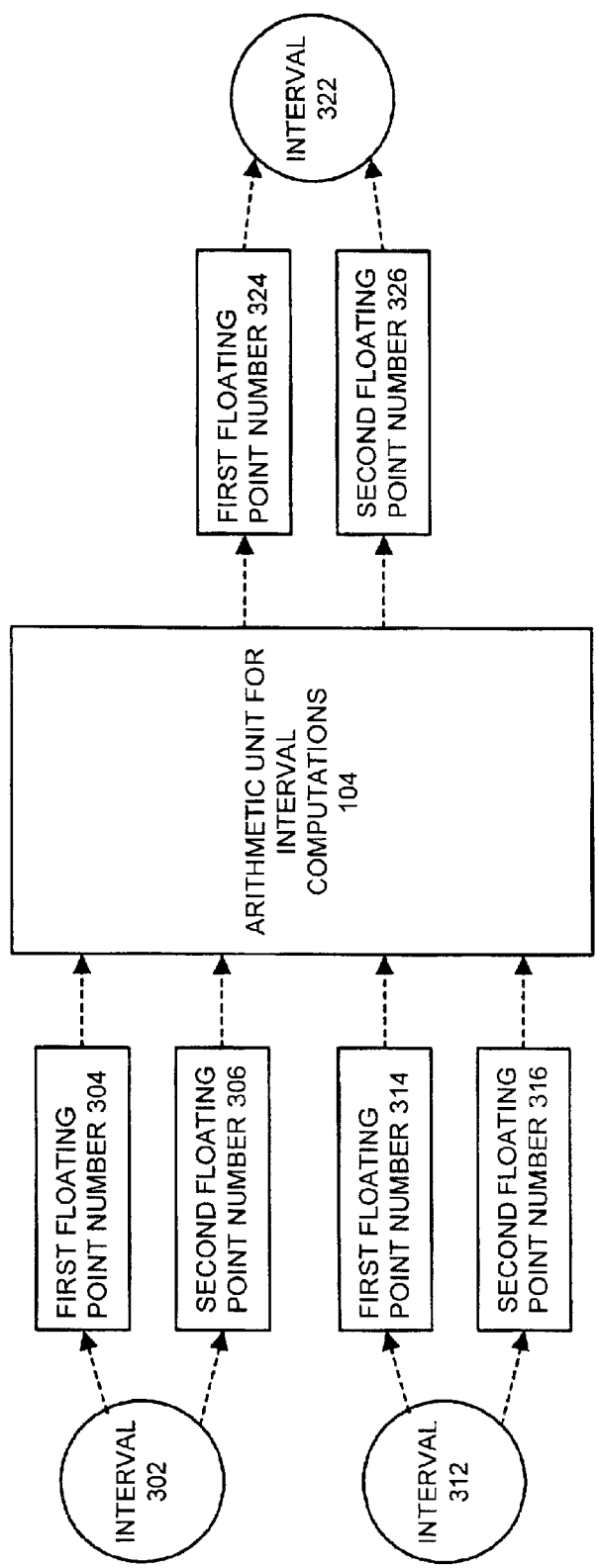
FIG. 3 illustrates an arithmetic unit for interval computations in accordance with an embodiment of the present invention.

FIG. 3 illustrates arithmetic unit 104 for interval computations in more detail accordance with an embodiment of the present invention. Details regarding the construction of such an arithmetic unit are well known in the art. For example, see U.S. Pat. Nos. 5,687,106 and 6,044,454. Arithmetic unit 104 receives intervals 302 and 312 as inputs and produces interval 322 as an output.

In the embodiment illustrated in FIG. 3, interval 302 includes a first floating-point number 304 representing a first endpoint of interval 302, and a second floating-point number 306 representing a second endpoint of interval 302. Similarly, interval 312 includes a first floating-point number 314 representing a first endpoint of interval 312, and a second floating-point number 316 representing a second endpoint of interval 312. Also, the resulting interval 322 includes a first floating-point number 324 representing a first endpoint of interval 322, and a second floating-point number 326 representing a second endpoint of interval 322.

Note that arithmetic unit 104 includes circuitry for performing the interval operations that are outlined in FIG. 5. This circuitry enables the interval operations to be performed efficiently.

However, note that the present invention can also be applied to computing devices that do not include special-purpose hardware for performing interval operations. In such computing devices, compiler 204 converts interval operations into a executable code that can be executed using standard computational hardware that is not specially designed for interval operations.

Figure 4:
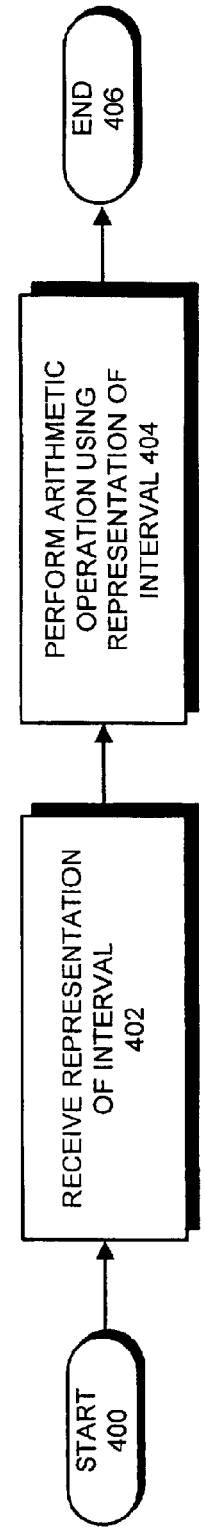
FIG. 4 is a flow chart illustrating the process of performing an interval computation in accordance with an embodiment of the present invention.

FIG. 4 is a flow chart illustrating the process of performing an interval computation in accordance with an embodiment of the present invention. The system starts by receiving a representation of an interval, such as first floating-point number 304 and second floating-point number 306 (step 402). Next, the system performs an arithmetic operation using the representation of the interval to produce a result (step 404). The possibilities for this arithmetic operation are described in more detail below with reference to FIG. 5.

Interval Operations

FIG. 5 illustrates four different interval operations in accordance with an embodiment of the present invention. These interval operations operate on the intervals X and Y. The interval X includes two endpoints, $\underline{x}$ denotes the lower bound of X, and $\overline{x}$ denotes the upper bound of X.

The interval X is a closed subset of the extended (including $-\infty$ and $+\infty$) real numbers R* (see line 1 of FIG. 5). Similarly the interval Y also has two endpoints and is a closed subset of the extended real numbers R* (see line 2 of FIG. 5).

Note that an interval is a point or degenerate interval if X=[x,x]. Also note that the left endpoint of an interior interval is always less than or equal to the right endpoint. The set of extended real numbers, R* is the set of real numbers, R, extended with the two ideal points negative infinity and positive infinity:

$$R^* = R \cup \{-\infty\} \cup \{+\infty\}.$$

In the equations that appear in FIG. 5, the up arrows and down arrows indicate the direction of rounding in the next and subsequent operations. Directed rounding (up or down) is applied if the result of a floating-point operation is not machine-representable.

The addition operation X+Y adds the left endpoint of X to the left endpoint of Y and rounds down to the nearest floating-point number to produce a resulting left endpoint, and adds the right endpoint of X to the right endpoint of Y and rounds up to the nearest floating-point number to produce a resulting right endpoint.

Similarly, the subtraction operation X−Y subtracts the right endpoint of Y from the left endpoint of X and rounds down to produce a resulting left endpoint, and subtracts the left endpoint of Y from the right endpoint of X and rounds up to produce a resulting right endpoint.

The multiplication operation selects the minimum value of four different terms (rounded down) to produce the resulting left endpoint. These terms are: the left endpoint of X multiplied by the left endpoint of Y; the left endpoint of X multiplied by the right endpoint of Y; the right endpoint of X multiplied by the left endpoint of Y; and the right endpoint of X multiplied by the right endpoint of Y. This multiplication operation additionally selects the maximum of the same four terms (rounded up) to produce the resulting right endpoint.

Similarly, the division operation selects the minimum of four different terms (rounded down) to produce the resulting left endpoint. These terms are: the left endpoint of X divided by the left endpoint of Y; the left endpoint of X divided by the right endpoint of Y; the right endpoint of X divided by the left endpoint of Y; and the right endpoint of X divided by the right endpoint of Y. This division operation additionally selects the maximum of the same four terms (rounded up) to produce the resulting right endpoint. For the special case where the interval Y includes zero, X/Y is an exterior interval that is nevertheless contained in the interval R*.

Note that the result of any of these interval operations is the empty interval if either of the intervals, X or Y, are the empty interval. Also note, that in one embodiment of the present invention, extended interval operations never cause undefined outcomes, which are referred to as "exceptions" in the IEEE 754 standard.

Term Consistency

Figure 6:
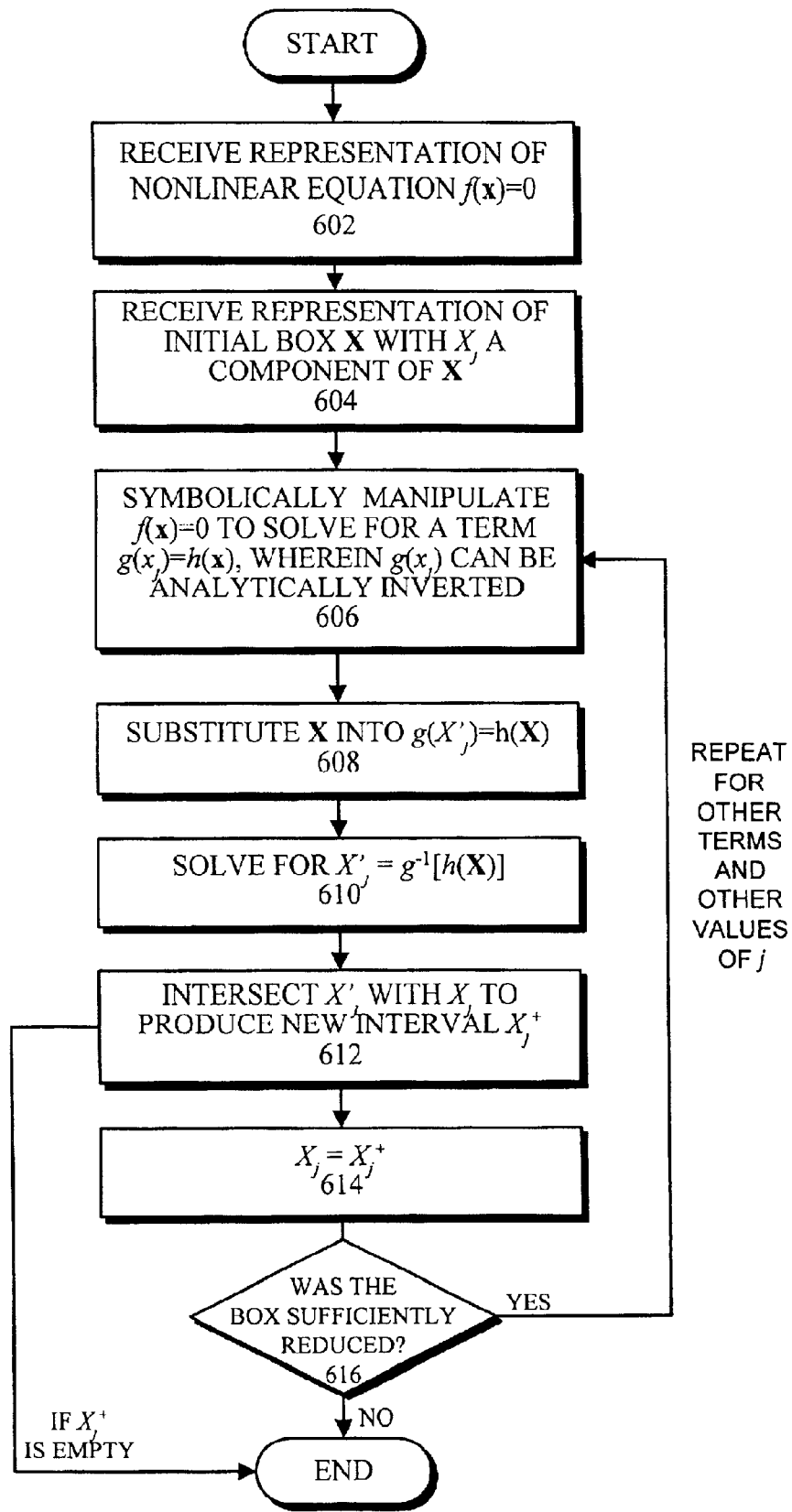
FIG. 6 is a flow chart illustrating the process of finding an interval solution to a nonlinear equation in accordance with an embodiment of the present invention.
Figure 7A:
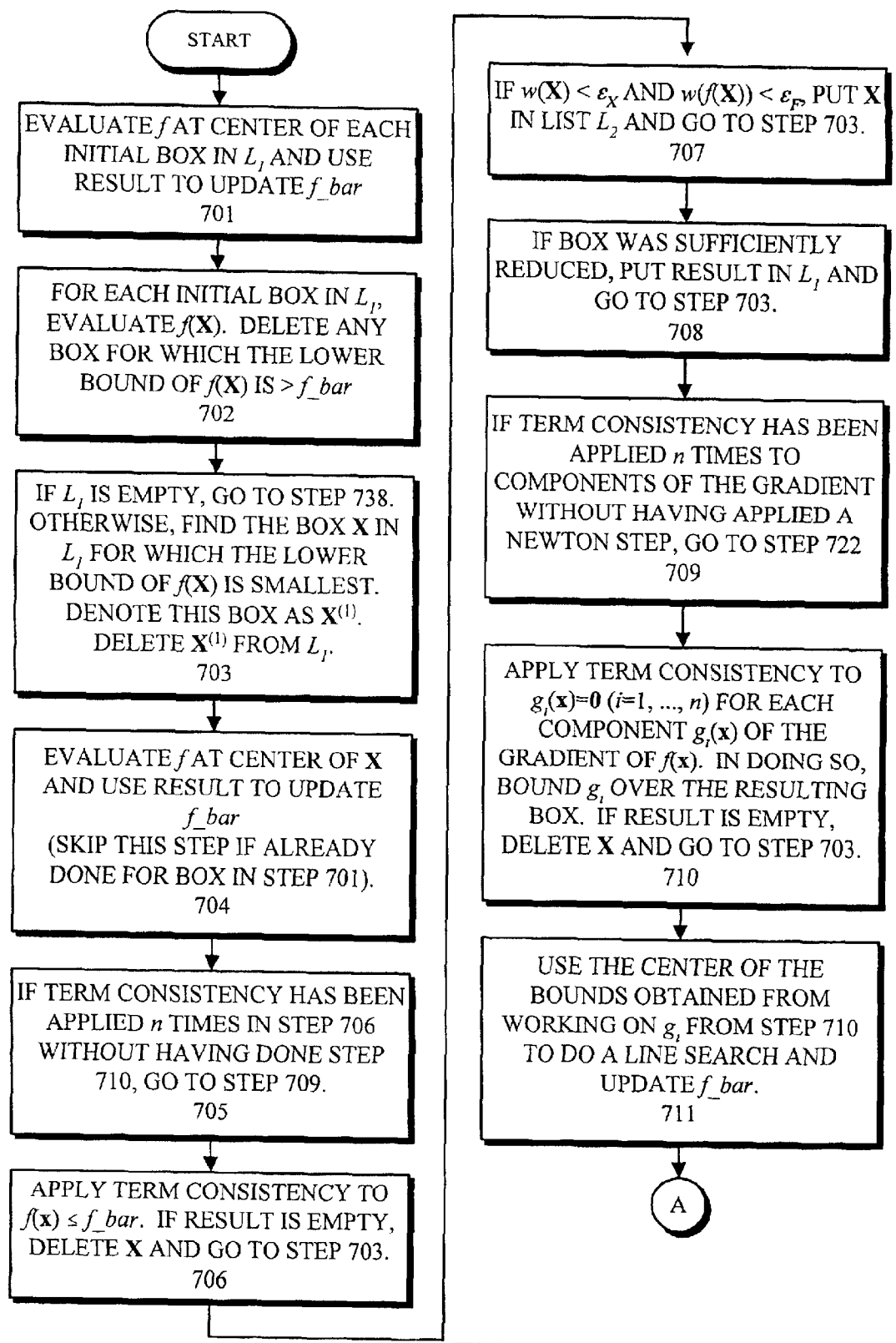
FIG. 7A is a first portion of a flow chart illustrating the process of solving an unconstrained interval global optimization problem in accordance with an embodiment of the present invention.
Figure 7B:
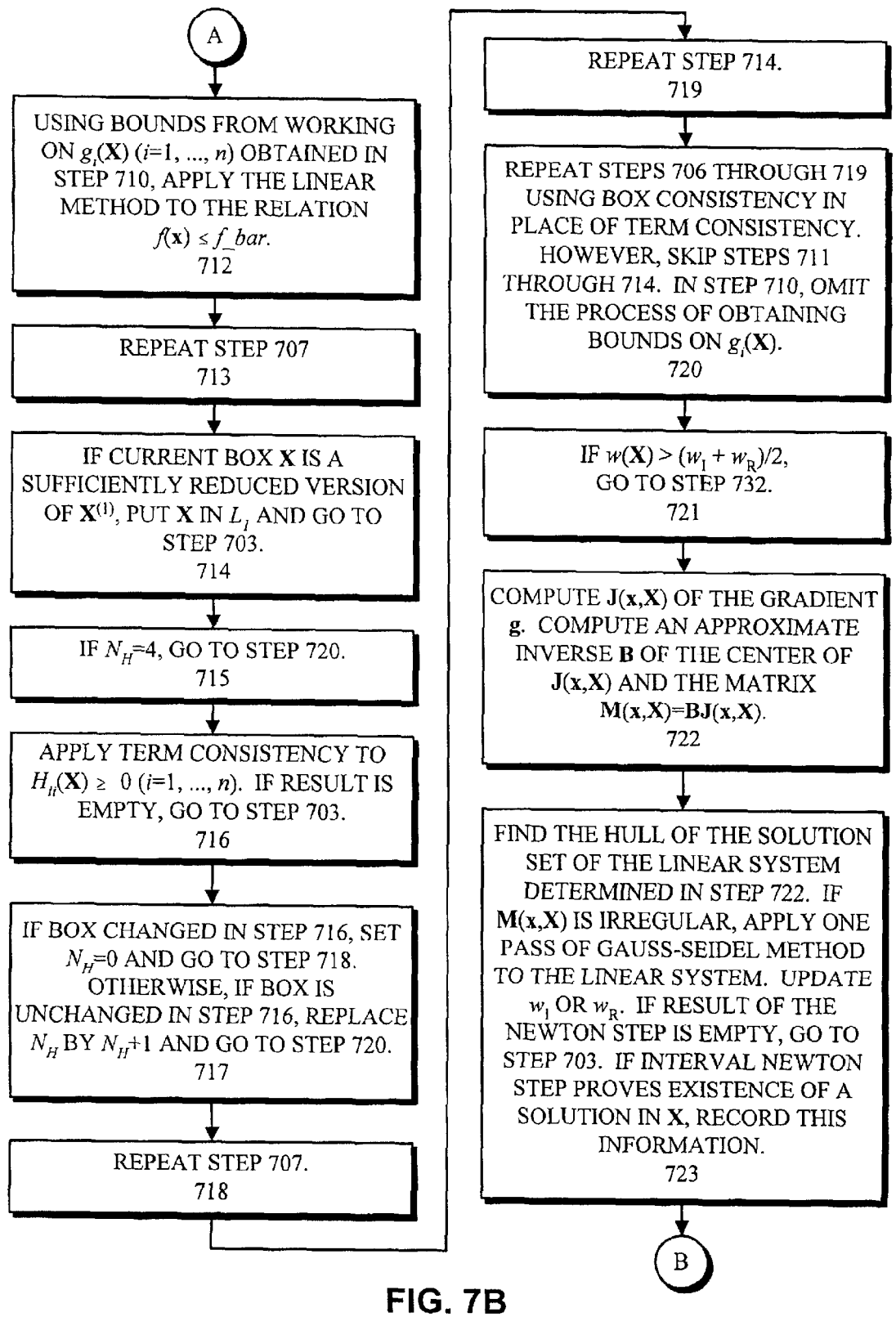
FIG. 7B is a second portion of a flow chart illustrating the process of solving an unconstrained interval global optimization problem in accordance with an embodiment of the present invention.
Figure 7C:
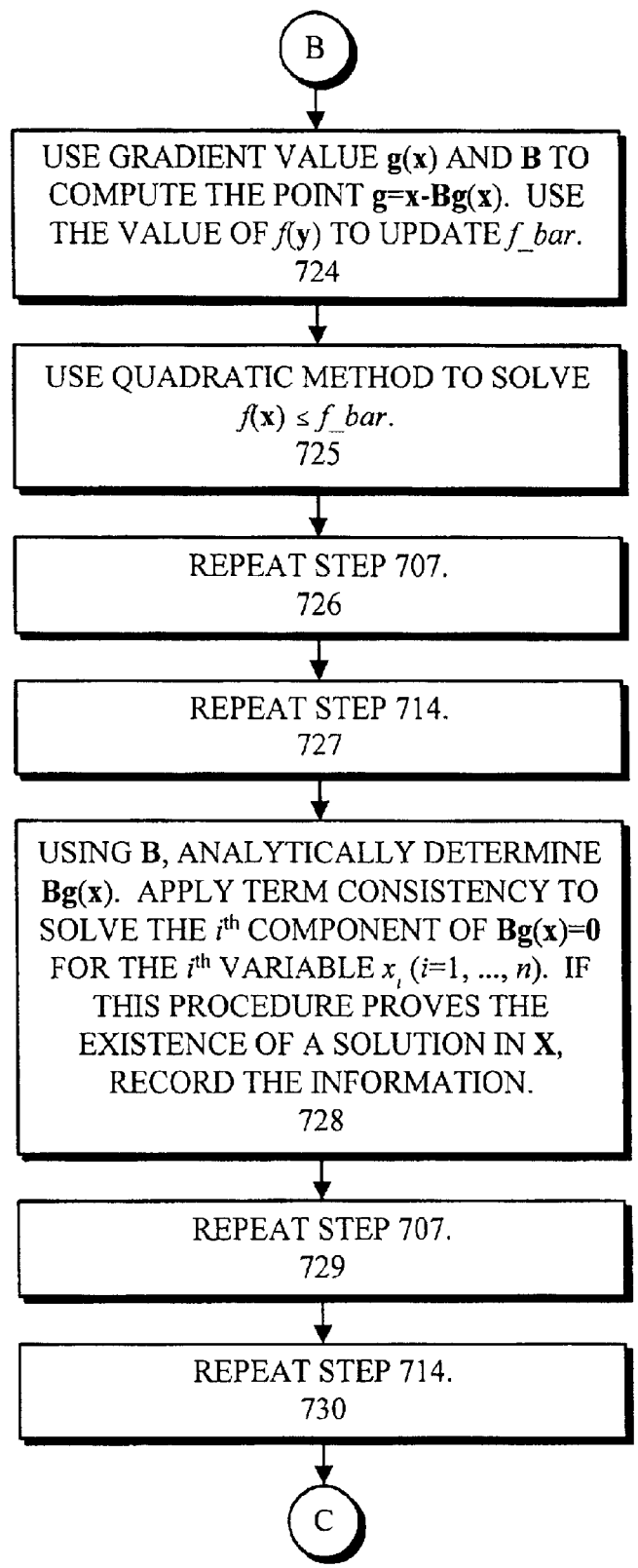
FIG. 7C is a third portion of a flow chart illustrating the process of solving an unconstrained interval global optimization problem in accordance with an embodiment of the present invention.
Figure 7D:
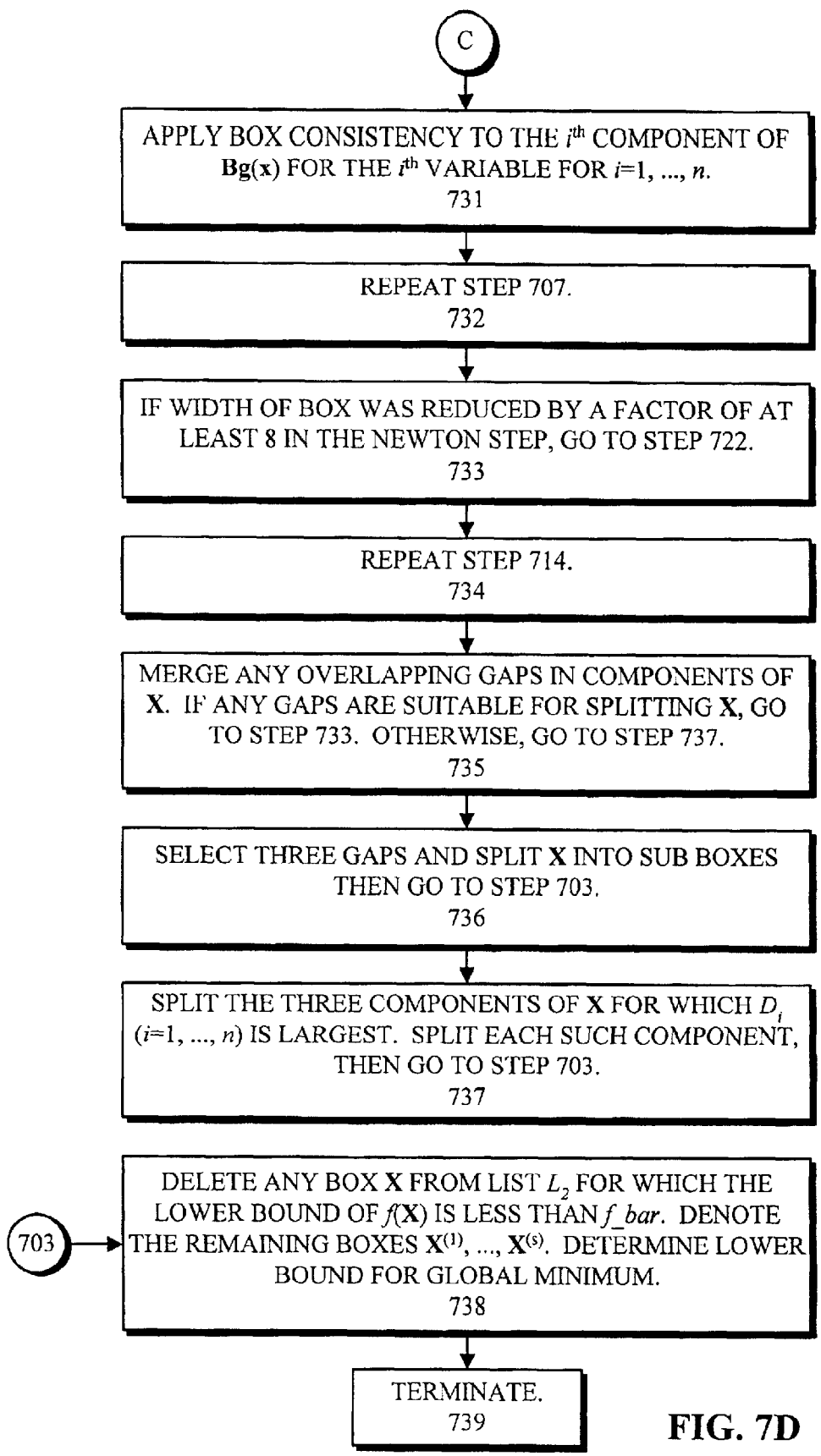
FIG. 7D is a fourth portion of a flow chart illustrating the process of solving an unconstrained interval global optimization problem in accordance with an embodiment of the present invention.

FIG. 6 is a flow chart illustrating the process of solving a nonlinear equation through interval arithmetic and term consistency in accordance with an embodiment of the present invention. The system starts by receiving a representation of a nonlinear equation $f(x)=0$ (step 602), as well as a representation of an initial box with X with $X_j$ an element of X (step 604). Next, the system symbolically manipulates the equation $f(x)=0$ into a form $g(x_j)-h(x)=0$, wherein the term $g(x_j)$ can be analytically inverted to produce an inverse function $g^{-1}(y)$ (step 606).

Next, the system substitutes the initial box X into h(X) to produce the equation $g(X'_j)=h(X)$ (step 608). The system then solves for $X'_j=g^{-1}(h(X))$ (step 610). The resulting interval $X'_j$ is then intersected with the initial interval $X_j$ to produce a new interval $X_j^+$ (step 612).

At this point, if $X_j^+$ is empty, the system can terminate. Otherwise, the system can perform further processing. This further processing involves saving $X_j$ by setting $X^{(0)}=X_j$ and also, setting $X_j=X_j^+$ (step 614). Next, if $w(X^{(0)})$ is sufficiently reduced at step 616, the system returns to step 606 for another iteration of term consistency on another term g of $f(x)$. Otherwise, the system terminates.

Examples of Applying Term Consistency

For example, suppose $f(x)=x^2-x+6$. We can define $g(x)=x^2$ and $h(x)=x-6$. Let X=[−10,10]. The procedural step is $(X')^2=X-6=[-16,4]$. Since $(X')^2$ must be non-negative, we replace this interval by [0,4]. Solving for X', we obtain $X'=\pm[0,2]$. In replacing the range of h(x) (i.e., [−16,4]) by non-negative values, we have excluded that part of the range h(x) that is not in the domain of $g(x)=x^2$.

Suppose that we reverse the roles of g and h and use the iterative step $h(X')=g(X)$. That is $X'-6=X^2$. We obtain X'=[6,106]. Intersecting this result with the interval [−10,10], of interest, we obtain [6,10]. This interval excludes the set of values for which the range of g(X) is not in the intersection of the domain of h(X) with X.

Combining these results, we conclude that any solution of $f(X)=g(X)-h(X)=0$ that occurs in X=[−10,10] must be in both [−2,2] and [6,10]. Since these intervals are disjoint, there can be no solution in [−10,10].

In practice, if we already reduced the interval from [−10,10] to [−2,2] by solving for g, we use the narrower interval as input when solving for h.

This example illustrates the fact that it can be advantageous to solve a given equation for more than one of its terms. The order in which terms are chosen affects the efficiency. Unfortunately, it is not known how best to choose the best order.

Also note that there can be many choices for g(x). For example, suppose we use term consistency to narrow the interval bound X on a solution of $f(x)=ax^4+bx+c=0$. We can let $g(x)=bx$ and compute $X'=-(aX^4+c)/b$ or we can let $g(x)=ax^4$ and compute $X'=\pm[-(bX+c)/a]^{1/4}$. We can also separate $x^4$ into $x^2*x^2$ and solve for one of the factors $X'=\pm[-(bX+c)/(aX^2)]^{1/2}$.

In the multidimensional case, we may solve for a term involving more than one variable. We then have a two-stage process. For example, suppose we solve for the term $1/(x+y)$ from the function $f(x,y)=1/(x+y)-h(x,y)=0$. Let $x \in X=[1,2]$ and $y \in Y=[0.5,2]$. Suppose we find that h(X,Y)=[0.5,1]. Then $1/(x+y) \in [0.5,1]$ so $x+y \in [1,2]$. Now we replace y by Y=[0.5,2] and obtain the bound [−1,1.5] on X. Intersecting this interval with the given bound X=[1,2] on x, we obtain the new bound X'=[1,1.5].

We can use X' to get a new bound on h; but this may require extensive computing if h is a complicated function; so suppose we do not. Suppose that we do, however, use this bound on our intermediate result x+y=[1,2]. Solving for y as [1,2]−X', we obtain the bound [−0.5,1]. Intersecting this interval with Y, we obtain the new bound Y'=[0.5,1] on y. Thus, we improve the bounds on both x and y by solving for a single term of $f$.

The point of these examples is to show that term consistency can be used in many ways both alone and in combination with the interval Newton algorithm to improve the efficiency with which roots of a single nonlinear equation can be computed. The same is true for systems of nonlinear equations.

Unconstrained Interval Global Optimization

FIGS. 7A–7D collectively present a flow chart illustrating the process of solving an unconstrained global optimization problem in accordance with an embodiment of the present invention. This global optimization process computes guaranteed bounds on the globally minimum value $f^*$ of the objective function $f(x)$ and guaranteed bounds on the point (s) $x^*$ where $f(x)$ is a global minimum.

Assume a given box (or boxes) in which the solution is sought is placed in a list $L_1$ of boxes to be processed. Set $w_R$=0. If a single box $X^{(0)}$ is given, set $w_I$=w($X^{(0)}$). If more than one box is given, the system sets $w^I$ equal to the width of the largest box.

If an upper bound on the minimum value of $f(x)$ is known, set $f$_bar equal to this value. Otherwise, the system sets $f$_bar=+∞. Note that $f$_bar is the smallest upper bound so far computed on $f(x)$, wherein x is a point in the initial box. Moreover, $f$_bar can be used to eliminate from consideration any subbox whose lower bound is greater than $f$_bar, because such a subbox cannot contain the globally minimum value $f^*$. Note that we can use the inequality $f(x) > \geq f$_bar to delete parts of a subbox and can enhance this process for large boxes with term consistency.

A box size tolerance $\epsilon_X$ and a function width tolerance $\epsilon_F$ are specified to facilitate termination when the box size and the function width become smaller than pre-specified values. This prevents unnecessary processing.

We let $N^H$ denote the number of (consecutive) times that application of term consistency is applied to the set of relations $H_{ii}(x) \geq 0$ (i=1, . . . , n) and fails to reduce the current box. (Note that $H_{ii}(x)$ (i=1, . . . , n) represent the diagonal elements of the Hessian of the objection function $f(x)$.) We begin with $N^H$=0.

Thus, to initialize our process, we specify $\epsilon_X$, $\epsilon_F$, $w_R$, $w_I$, $N^H$, and the initial box(es). In addition, we specify an upper bound on $f$_bar on $f^*$ if one is known.

We perform the following steps in the order given except as indicated by branching. For each step, the current box is denoted by X even though it may be altered in one or more steps.

The system first evaluates $f$ at (an approximation for) the center of each initial box in $L_1$ and uses the result to update $f$_bar if possible (step 701). Note that $f$_bar is updated whenever a new upper bound on $f$ over a subbox X is found to be lower than the current $f$_bar.

Next, for each initial box X in $L_1$, the system evaluates $f(X)$. The system then deletes any box for which the lower bound of $f(X)$ is greater than $f$_bar (step 702).

If $L_1$ is empty, the system goes to step 738. Otherwise, the system finds the box X in $L_1$ for which the infimum of $f(X)$ is smallest. The system selects this box as the one to be processed next. For later reference denote this box by $X^{(1)}$. The system also deletes $X^{(1)}$ from $L_1$ (step 703).

Next, the system evaluates $f$ at (an approximation for) the center of X and uses the result to update $f$_bar. The system skips this step if it has already been done for this box in step 701 (step 704).

If term consistency has been applied n times in step 706 to the relation $f(x) \leq f$_bar without having done step 710, the system goes to step 709 (step 705). (Note that the integer n is the number of variables upon which $f$ depends.)

Next, the system applies term consistency to the relation $f(x) \leq f$_bar. If the result is empty, the system deletes X and goes to step 703 (step 706).

If $w(X) < \epsilon_X$ and $w(f(X)) < \epsilon_F$, the system puts X in list $L_2$ and goes to step 703 (step 707).

If the box was sufficiently reduced in step 706, the system puts the result in $L_1$ and goes to step 703 (step 708). We say that a box X is sufficiently reduced if any component of X is reduced by an amount that is at least a fraction (say 0.25) of the width of the widest component of X.

If term consistency has been applied n times in step 710 to the components of the gradient without having applied a Newton step in step 723, the system goes to step 722 (step 709).

Next, the system applies term consistency to $g_i(x)=0$ (i=1, . . . , n) for each component $g_i(x)$ of the gradient of $f(x)$. In so doing, the system bounds $g_i$ over the resulting box. If a result is empty, the system deletes X and goes to step 703 (step 710).

Next, the system uses the center of the bounds obtained from working on $g_i$ in step 710 to do a line search to update $f$_bar (step 711). A line search can be performed as follows. Suppose we evaluate the gradient g(x) of $f(x)$ at a point x. Note that $f$ decreases (locally) in the negative gradient direction from x. A simple procedure for finding a point where $f$ is small is to search along this half-line. Let x be the center of the current box. Define the half-line of points $y(\alpha)=x-\alpha g(x)$ where $\alpha \geq 0$. We now use a standard procedure for finding an approximate minimum of the objective function $f$ on this half-line. We first restrict our region of search by determining the value $\alpha'$ such that $y(\alpha')=x-\alpha'g(x)$ is on the boundary of the current box X, and search between x and $x'=y(\alpha')$. We use the following procedure. Each application of the procedure requires an evaluation of $f$. Procedure: If $f(x') < f(x)$, replace x by (x+x')/2. Otherwise, we replace x' by (x+x')/2.

The system then uses the bounds on $g_i(X)$ (i=1, . . . , n) obtained in step 710 to apply a linear method, that uses a Taylor expansion to linearize $f(x)$, to the relation $f(x) \leq f$_bar (step 712).

Next, the system repeats step 707 (step 713).

Then, if the current box X is a sufficiently reduced version of the box $X^{(1)}$ defined in step 703, the system puts X in list $L_1$ and goes to 703 (step 714).

If $N^H$=4, the system goes to step 720 (step 715).

Next, the system applies term consistency to the relation $H_{ii}(X) \geq 0$ for i=1, . . . , n. If the result is empty, the system goes to step 703 (step 716).

If the box is changed in step 716, the system sets $N^H$=0 and goes to step 718. Otherwise, if the box is unchanged in step 716, the system replaces $N^H$ by $N^H$+1 and goes to step 710 (step 717).

Next, the system repeats step 707 (step 718).

It also repeats step 714 (step 719).

The system then repeats steps 706–719 using box consistency in place of term consistency. However, the system skips steps 711–714. In step 710, the system omits the process of obtaining bounds on $g_i(X)$ (step 720). (Box consistency is described in "Global Optimization Using Interval Analysis" by Eldon R. Hansen, Marcel Dekker, Inc., 1992.)

If $w(X)>(w_I+w_R)/2$, the system goes to step 732 (step 721). Note that, $w_I$ denotes the width of the smallest box for which we have found $M^I=BJ(x,X)$ to be irregular. If $M^I$ is regular for a given box, $w_R$ denotes the width of the largest box for which we have found $M^I$ to be regular. Initially, we set $w_I=w(X^{(0)})$ and $w_R=0$.

Next, the system computes the Jacobian $J(x,X)$ of the gradient g. It also computes an approximate inverse B of the approximate center of $J(x,X)$ and the matrix $M(x,X)=BJ(x,X)$ (step 722).

The system finds the hull of the solution set of the linear system determined in step 722 and in the process determines if $M(x,X)$ is regular. If $M(x,X)$ is irregular, the system applies one pass of the Gauss-Seidel method to the linear system. The system also updates $w_I$ or $w_R$. If the result of the Newton step is empty, the system goes to step 703. If the interval Newton step proves the existence of a solution in X, the system records this information (step 723).

Next, the system uses the gradient value g(x) and the matrix B computed in step 722 to compute the point y=x−Bg(x). The system uses the value of f(y) to update $f\_bar$ (step 724).

The system then uses a quadratic method to solve $f(x) \leq f\_bar$ (step 725).

Next, the system repeats step 707 (step 726).

It also repeats step 714 (step 727).

Using the matrix B computed in step 722, the system analytically determines the system Bg(x), and then applies term consistency to solve the i-th component of Bg(x) for the i-th variable $x_i$ for i=1, ..., n. If this procedure proves the existence of a solution in X, the system records this information (step 728).

Next, the system repeats step 707 (step 729).

It also repeats step 714 (step 730).

Next, the system applies box consistency to solve the i-th component of Bg(x) as determined in step 725 for the i-th variable for i=1, ..., n. (step 731).

Next, the system repeats step 707 (step 732).

If the width of the box was reduced by a factor of at least eight in the Newton step in step 723, the system goes to step 722 (step 733).

Next, the system repeats step 714 (step 734).

The system then merges any overlapping gaps in components of X if any were generated using term consistency, box consistency, and/or the Newton method. If there are any gaps (after merging) that are suitable for use in splitting X, the system goes to step 733. Suitability for splitting can be determined by ensuring that the splitting results in a sufficient size reduction in a component of X. If there are no such suitable gaps, the system goes to step 737 (step 735).

Next, the system selects three (or fewer if fewer exist) gaps and splits X into subboxes. The system then goes to step 703 (step 736).

The system then splits the three (or n if n<3) components of X for which $D_i$ (i=1, ..., n) is largest. The system splits each such component by using a technique that gives preference to components over which the objective function varies the most. For example, we can approximate the change in $f$ resulting from the i-th variable changing over $X_i$ using the approximation $D_i=w[g_i(X)]w(X_i)$. The system then goes to step 703 (step 737).

Next, the system deletes any box X from list $L_2$ for which the lower bound of $f(X)>f\_bar$. The system denotes the remaining boxes by $X^{(1)}, \ldots, X^{(s)}$ where s is the number of boxes remaining. The system determines the lower bound for the global minimum $f^*$ as the minimum over $1 \leq i \leq n$ of the lower bound of $f(X^{(i)})$ (step 738).

Finally, the system terminates (step 739).

Discussion of the Process

The above-described process begins with procedures that involve the least amount of computing. We use term consistency first because it does not require computation of derivatives (and because it is effective in reducing large boxes).

For efficiency, the best box X to process is the one for which the lower bound of $f(X)$ is smallest. This tends to quickly reduce the upper bound $f\_bar$. Because it is important to reduce $f\_bar$ as quickly as possible, the process returns to step 703 frequently to determine the box to process next.

We stop using the relations $H_{ii}(x) \geq 0$ (i=1, ..., n) when there is evidence that the remaining boxes are in a region where $f$ is convex. See step 715. Using a similar philosophy, we begin using the Newton method more often when there is evidence that it will be effective. See step 721.

Note that the Jacobian $J(x,X)$ is the Hessian of the objective function $f$. Therefore, knowing $J(x,X)$ provides the means for determining the second order Taylor expansion of $f$. The gradient g(x) needed for this expansion is also computed when applying the Newton method in step 723.

Therefore, we have the data required to use the quadratic method to solve the relation $f(x) \leq f\_bar$. See step 725. If these data are not already available, it may not be worth generating them simply to solve $f(x) \leq f\_bar$ using the quadratic method.

Step 717 is done after term consistency is applied to the relation $H_{ii}(X) \geq 0$. When the box is unchanged, the count $N^H$ is increased by 1. Step 717 is repeated after box consistency is applied to what may be the same box. See step 720. Therefore, the count $N^H$ can increase faster than one might otherwise expect.

The algorithm avoids too many applications of term consistency before changing procedures. Step 705 can force application of term consistency to the gradient instead of to the inequality $f \leq f\_bar$. Step 709 can force change from applying term consistency to the gradient to applying a Newton step. This takes precedence over our desire not to apply a Newton step when it may not be efficient.

We need occasional checks of efficiency of the Newton method because the current box may have become so small that the Newton method exhibits quadratic convergence and thus is more efficient than term consistency. When we force a change from term consistency, we also force a change from box consistency. This occurs because we do not apply the latter without having previously applied the former.

Step 733 causes the Newton step to be repeated. If the Newton method is exhibiting quadratic convergence, we want to take advantage of its ability to progress rapidly.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. For example, although the present invention describes the use of derivatives in certain situations, it is often possible to use slopes instead of derivatives.

Additionally, the above disclosure is not intended to limit the present invention. The scope of the present invention is defined by the appended claims.

What is claimed is:

1. A method for using a computer system to solve an unconstrained interval global optimization problem specified by a function $f$, wherein $f$ is a scalar function of a vector $x=(x_1, x_2, x_3, \ldots x_n)$, the method comprising:
  receiving a representation of the function $f$ at the computer system;
  storing the representation in a memory within the computer system; and
  performing an interval global optimization process to compute guaranteed bounds on a globally minimum value of the function $f(x)$ over a subbox X;
  wherein performing the interval global optimization process involves,
    applying term consistency to a set of relations associated with the function $f$ over the subbox X, and excluding any portion of the subbox X that violates any of these relations,
    applying box consistency to the set of relations associated with the function $f$ over the subbox X, and excluding any portion of the subbox X that violates any of these relations, and
    performing an interval Newton step on the subbox X to produce a resulting subbox Y, wherein the point of expansion of the interval Newton step is a point x within the subbox X, and wherein performing the interval Newton step involves evaluating the gradient $g(x)$ of the function $f(x)$ using interval arithmetic; and
  recording the guaranteed bounds in the memory within the computer system.

2. The method of claim 1, wherein applying term consistency involves:
  symbolically manipulating an equation within the computer system to solve for a term $g(x_j)$, thereby producing a modified equation $g(x_j)=h(x)$, wherein the term $g(x_j)$ can be analytically inverted to produce an inverse function $g^{-1}(y)$;
  substituting the subbox X into the modified equation to produce the equation $g(X'_j)=h(X)$;
  solving for $X'_j=g^{-1}(h(X))$; and
  intersecting $X'_j$ with the interval $X_j$ to produce a new subbox $X^+$;
  wherein the new subbox $X^+$ contains all solutions of the equation within the subbox X, and wherein the size of the new subbox $X^+$ is less than or equal to the size of the subbox X.

3. The method of claim 1, wherein performing the interval global optimization process involves:
  keeping track of a smallest upper bound $f\_bar$ of the function $f(x)$;
  removing from consideration any subbox X for which $f(X)>f\_bar$; and
  wherein applying term consistency to the $f\_bar$ relation involves applying term consistency to the inequality $f(x) \leq f\_bar$ over the subbox X.

4. The method of claim 3, wherein applying box consistency to the set of relations involves applying box consistency to the inequality $f(x) \leq f\_bar$ over the subbox X.

5. The method of claim 1, wherein performing the interval global optimization process involves:
  determining the gradient $g(x)$ of the function $f(x)$, wherein $g(x)$ includes components $g_i(x)$ (i=1, ..., n);
  removing from consideration any subbox for which any element of $g(x)$ is bounded away from zero, thereby indicating that the subbox does not include a stationary point of $f(x)$; and
  wherein applying term consistency to the set of relations involves applying term consistency to each component $g_i(x)=0$ (i=1, ..., n) of $g(x)=0$ over the subbox X.

6. The method of claim 5, wherein applying box consistency to the set of relations involves applying box consistency to each component $g_i(x)=0$ (i=1, ..., n) of $g(x)=0$ over the subbox X.

7. The method of claim 1, wherein performing the interval global optimization process involves:
  determining diagonal elements $H_{ii}(x)$ (i=1, ..., n) of the Hessian of the function $f(x)$;
  removing from consideration any subbox for which a diagonal element of the Hessian is always negative, which indicates that the function $f$ is not convex and consequently does not contain a global minimum within the subbox;
  wherein applying term consistency to the set of relations involves applying term consistency to each inequality $H_{ii}(x) \geq 0$ (i=1, ..., n) over the subbox X.

8. The method of claim 7, wherein applying box consistency to the set of relations involves applying box consistency to each inequality $H_{ii}(x) \geq 0$ (i=1, ..., n) over the subbox X.

9. The method of claim 1,
  wherein performing the interval Newton step involves,
    computing the Jacobian $J(x,X)$ of the gradient g evaluated as a function of a point x over the subbox X,
    computing an approximate inverse B of the center of $J(x,X)$, and
    using the approximate inverse B to analytically determine the system $Bg(x)$, wherein $g(x)$ is the gradient of the function $f(x)$, and wherein $g(x)$ includes components $g_i(x)$ (i=1, ..., n); and
  wherein applying term consistency to the set of relations involves applying term consistency to each component $(Bg(x))_i=0$ (i=1, ..., n) for each variable $x_i$(i=1, ..., n) over the subbox X.

10. The method of claim 9, wherein applying box consistency to the set of relations involves applying box consistency to each component $(Bg(x))_i=0$ (i=1, ..., n) for each variable $x_i$ (i=1, ..., n) over the subbox X.

11. The method of claim 1, further comprising terminating attempts to further reduce the subbox X when:
  the width of X is less than a first threshold value; and
  the magnitude of $f(X)$ is less than a second threshold value.

12. The method of claim 11, wherein performing the interval Newton step involves:
  computing $J(x,X)$, wherein $J(x,X)$ is the Jacobian of the function $f$ evaluated as a function of x over the subbox X; and
  determining if $J(x,X)$ is regular as a byproduct of solving for the subbox Y that contains values of y that satisfy $M(x,X)(y-x)=r(x)$, where $M(x,X)=BJ(x,X)$, $r(x)=-Bf(x)$, and B is an approximate inverse of the center of $J(x,X)$.

13. A computer-readable storage medium storing instructions that when executed by a computer cause the computer to perform a method for using a computer system to solve an unconstrained interval global optimization problem specified by a function $f$, wherein $f$ is a scalar function of a vector $x=(x_1, x_2, x_3, \ldots, x_n)$, the method comprising:
  receiving a representation of the function $f$ at the computer system;

storing the representation in a memory within the computer system; and performing an interval global optimization process to compute guaranteed bounds on a globally minimum value of the function $f(x)$ over a subbox X;

wherein performing the interval global optimization process involves, applying term consistency to a set of relations associated with the function $f$ over the subbox X, and excluding any portion of the subbox X that violates any of these relations, applying box consistency to the set of relations associated with the function $f$ over the subbox X, and excluding any portion of the subbox X that violates any of these relations, and performing an interval Newton step on the subbox X to produce a resulting subbox Y, wherein the point of expansion of the interval Newton step is a point x within the subbox X, and wherein performing the interval Newton step involves evaluating the gradient $g(x)$ of the function $f(x)$ using interval arithmetic.

14. The computer-readable storage medium of claim 13, wherein applying term consistency involves:

symbolically manipulating an equation within the computer system to solve for a term $g(x_j)$, thereby producing a modified equation $g(x_j)=h(x)$, wherein the term $g(x_j)$ can be analytically inverted to produce an inverse function $g^{-1}(y)$;

substituting the subbox X into the modified equation to produce the equation $g(X'_j)=h(X)$;

solving for $X'_j=g^{-1}(h(X))$; and intersecting $X'_j$ with the interval $X_j$ to produce a new subbox $X^+$;

wherein the new subbox $X^+$ contains all solutions of the equation within the subbox X, and wherein the size of the new subbox $X^+$ is less than or equal to the size of the subbox X.

15. The computer-readable storage medium of claim 13, wherein performing the interval global optimization process involves:

keeping track of a smallest upper bound $f\_bar$ of the function $f(x)$;

removing from consideration any subbox X for which $f(X) > f\_bar$; and wherein applying term consistency to the $f\_bar$ relation involves applying term consistency to the inequality $f(x) \leq f\_bar$ over the subbox X.

16. The computer-readable storage medium of claim 15, wherein applying box consistency to the set of relations involves applying box consistency to the inequality $f(x) \leq f\_bar$ over the subbox X.

17. The computer-readable storage medium of claim 13, wherein performing the interval global optimization process involves:

determining the gradient $g(x)$ of the function $f(x)$, wherein $g(x)$ includes components $g_i(x)$ (i=1, . . . , n);

removing from consideration any subbox for which any element of $g(x)$ is bounded away from zero, thereby indicating that the subbox does not include a stationary point of $f(x)$; and wherein applying term consistency to the set of relations involves applying term consistency to each component $g_i(x)=0$ (i=1, . . . , n) of $g(x)=0$ over the subbox X.

18. The computer-readable storage medium of claim 17, wherein applying box consistency to the set of relations involves applying box consistency to each component $g_i(x)=0$ (i=1, . . . , n) of $g(x)=0$ over the subbox X.

19. The computer-readable storage medium of claim 13, wherein performing the interval global optimization process involves:

determining diagonal elements $H_{ii}(x)$ (i=1, . . . , n) of the Hessian of the function $f(x)$;

removing from consideration any subbox for which a diagonal element of the Hessian is always negative, which indicates that the function $f$ is not convex and consequently does not contain a global minimum within the subbox;

wherein applying term consistency to the set of relations involves applying term consistency to each inequality $H_{ii}(x) \geq 0$ (i=1, . . . , n) over the subbox X.

20. The computer-readable storage medium of claim 19, wherein applying box consistency to the set of relations involves applying box consistency to each inequality $H_{ii}(x) \geq 0$ (i=1, . . . , n) over the subbox X.

21. The computer-readable storage medium of claim 13, wherein performing the interval Newton step involves, computing the Jacobian $J(x,X)$ of the gradient g evaluated as a function of a point x over the subbox X, computing an approximate inverse B of the center of $J(x,X)$, and using the approximate inverse B to analytically determine the system $Bg(x)$, wherein $g(x)$ is the gradient of the function $f(x)$, and wherein $g(x)$ includes components $g_i(x)$ (i=1, . . . , n); and wherein applying term consistency to the set of relations involves applying term consistency to each component $(Bg(x))_i=0$ (i=1, . . . , n) for each variable $x_i$ (i=1, . . . , n) over the subbox X.

22. The computer-readable storage medium of claim 21, wherein applying box consistency to the set of relations involves applying box consistency to each component $(Bg(x))_i=0$ (i=1, . . . , n) for each variable $x_i$ (i=1, . . . , n) over the subbox X.

23. The computer-readable storage medium of claim 13, wherein the method further comprises terminating attempts to further reduce the subbox X when:

the width of X is less than a first threshold value; and the magnitude of $f(X)$ is less than a second threshold value.

24. The computer-readable storage medium of claim 13, wherein performing the interval Newton step involves:

computing $J(x,X)$, wherein $J(x,X)$ is the Jacobian of the function $f$ evaluated as a function of x over the subbox X; and determining if $J(x,X)$ is regular as a byproduct of solving for the subbox Y that contains values of y that satisfy $M(x,X)(y-x)=r(x)$, where $M(x,X)=BJ(x,X)$, $r(x)=-Bf(x)$, and B is an approximate inverse of the center of $J(x,X)$.

25. An apparatus that solves an unconstrained interval global optimization problem specified by a function $f$, wherein $f$ is a scalar function of a vector $x=(x_1, x_2, x_3, \ldots x_n)$, the apparatus comprising:

a receiving mechanism that is configured to receive a representation of the function $f$;

a memory for storing the representation; and an interval global optimization mechanism that is configured to perform an interval global optimization process to compute guaranteed bounds on a globally minimum value of the function $f(x)$ over a subbox X;

a term consistency mechanism within the interval global optimization mechanism that is configured to apply term consistency to a set of relations associated with the function $f$ over the subbox X, and to exclude any portion of the subbox X that violates any of these relations;

a box consistency mechanism within the interval global optimization mechanism that is configured to apply box consistency to the set of relations associated with the function $f$ over the subbox X, and to exclude any portion of the subbox X that violates any of these relations;

an interval Newton mechanism within the interval global optimization mechanism that is configured to perform an interval Newton step on the subbox X to produce a resulting subbox Y, wherein the point of expansion of the interval Newton step is a point x within the subbox X, and wherein performing the interval Newton step involves evaluating the gradient g(x) of the function $f(x)$ using interval arithmetic; and a recording mechanism configured to record the guaranteed bounds in the memory.

26. The apparatus of claim 25, wherein the term consistency mechanism is configured to:

symbolically manipulate an equation to solve for a term $g(x_j)$, thereby producing a modified equation $g(x_j)=h(x)$, wherein the term $g(x_j)$ can be analytically inverted to produce an inverse function $g^{-1}(y)$;

substitute the subbox X into the modified equation to produce the equation $g(X'_j)=h(X)$;

solve for $X'_j=g^{-1}(h(X))$; and to intersect $X'_j$ with the interval $X_j$ to produce a new subbox $X^+$;

wherein the new subbox $X^+$ contains all solutions of the equation within the subbox X, and wherein the size of the new subbox $X^+$ is less than or equal to the size of the subbox X.

27. The apparatus of claim 25, wherein the interval global optimization mechanism is configured to, keep track of a smallest upper bound $f\_bar$ of the function $f(x)$, and to remove from consideration any subbox X for which $f(X)>f\_bar$; and wherein the term consistency mechanism is configured to apply term consistency to the inequality $f(x) \leq f\_bar$ over the subbox X.

28. The apparatus of claim 27, wherein the box consistency mechanism is configured to apply box consistency to the inequality $f(x) \leq f\_bar$ over the subbox X.

29. The apparatus of claim 25, wherein the interval global optimization mechanism is configured to, determine the gradient g(x) of the function $f(x)$, wherein g(x) includes components $g_i(x)$ (i=1, ..., n), and to remove from consideration any subbox for which any element of g(x) is bounded away from zero, thereby indicating that the subbox does not include a stationary point of $f(x)$; and wherein the term consistency mechanism is configured to apply term consistency to each component $g_i(x)=0$ (i=1, ..., n) of g(x)=0 over the subbox X.

30. The apparatus of claim 29, wherein the box consistency mechanism is configured to apply box consistency to each component $g_i(x)=0$ (i=1, ..., n) of g(x)=0 over the subbox X.

31. The apparatus of claim 25, wherein the interval global optimization mechanism is configured to, determine diagonal elements $H_{ii}(x)$ (i=1, ..., n) of the Hessian of the function $f(x)$, and to remove from consideration any subbox for which a diagonal element of the Hessian is always negative, which indicates that the function $f$ is not convex and consequently does not contain a global minimum within the subbox;

wherein the term consistency mechanism is configured to apply term consistency to each inequality $H_{ii}(x) \geq 0$ (i=1, ..., n) over the subbox X.

32. The apparatus of claim 31, wherein the box consistency mechanism is configured to apply box consistency to each inequality $H_{ii}(x) \geq 0$ (i=1, ..., n) over the subbox X.

33. The apparatus of claim 25, wherein the interval Newton mechanism is configured to, compute the Jacobian J(x,X) of the gradient g evaluated as a function of a point x over the subbox X, compute an approximate inverse B of the center of J(x,X), and to use the approximate inverse B to analytically determine the system Bg(x), wherein g(x) is the gradient of the function $f(x)$, and wherein g(x) includes components $g_i(x)$ (i=1, ..., n); and wherein the term consistency mechanism is configured to apply term consistency to each component $(Bg(x))_i=0$ (i=1, ..., n) for each variable $x_i$ (i=1, ..., n) over the subbox X.

34. The apparatus of claim 33, wherein the box consistency mechanism is configured to apply box consistency to each component $(Bg(x))_i=0$ (i=1, ..., n) for each variable $x_i$ (i=1, ..., n) over the subbox X.

35. The apparatus of claim 25, further comprising a termination mechanism that is configured to terminate attempts to further reduce the subbox X when:

the width of X is less than a first threshold value; and the magnitude of $f(X)$ is less than a second threshold value.

36. The apparatus of claim 35, wherein the interval Newton mechanism is configured to:, compute J(x,X), wherein J(x,X) is the Jacobian of the function $f$ evaluated as a function of x over the subbox X; and to determine if J(x,X) is regular as a byproduct of solving for the subbox Y that contains values of y that satisfy M(x,X)(y−x)=r(x), where M(x,X)=BJ(x,X), r(x)=−Bf(x), and B is an approximate inverse of the center of J(x,X).

* * * * *

UNITED STATES PATENT AND TRADEMARK OFFICE
CERTIFICATE OF CORRECTION

PATENT NO. : 6,922,713 B2
DATED : July 26, 2005
INVENTOR(S) : G. William Walster It is certified that error appears in the above-identified patent and that said Letters Patent is hereby corrected as shown below:

Column 13,
Line 42, please delete the equation "$X'_j{}' = g^{-1}(h(X))$" and replace with the symbol -- $X'_j = g^{-1}(h(X))$ --.

Signed and Sealed this

Twenty-seventh Day of September, 2005

JON W. DUDAS
*Director of the United States Patent and Trademark Office*